United States Patent
Arsovski

(10) Patent No.: US 9,177,646 B2
(45) Date of Patent: Nov. 3, 2015

(54) IMPLEMENTING COMPUTATIONAL MEMORY FROM CONTENT-ADDRESSABLE MEMORY

(71) Applicant: International Business Machines Corporation, Armonk, NY (US)

(72) Inventor: Igor Arsovski, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 13/888,108

(22) Filed: May 6, 2013

(65) Prior Publication Data

US 2014/0328103 A1 Nov. 6, 2014

(51) Int. Cl.
| G11C 15/00 | (2006.01) |
|---|---|
| G11C 15/04 | (2006.01) |
| G06F 17/30 | (2006.01) |
| G11C 11/56 | (2006.01) |
| G06F 11/10 | (2006.01) |
| G06F 12/10 | (2006.01) |

(52) U.S. Cl.
CPC .......... *G11C 15/04* (2013.01); *G06F 17/30982* (2013.01); *G11C 11/5642* (2013.01); *G11C 15/043* (2013.01); *G06F 11/1064* (2013.01); *G06F 12/1027* (2013.01)

(58) Field of Classification Search
CPC .............. G11C 15/043; G11C 11/5642; G06F 17/30982; G06F 12/1027; G06F 11/1064
USPC ............. 365/49.1, 49.11, 49.16, 49.17, 49.18
See application file for complete search history.

(56) References Cited

U.S. PATENT DOCUMENTS

| 5,535,410 | A | 7/1996 | Watanabe et al. |
|---|---|---|---|
| 5,742,180 | A | 4/1998 | DeHon et al. |
| 5,797,027 | A | 8/1998 | Kajiura |
| 6,052,773 | A | 4/2000 | DeHon et al. |
| 6,247,110 | B1 | 6/2001 | Huppenthal et al. |
| 6,339,819 | B1 | 1/2002 | Huppenthal et al. |
| 6,587,914 | B2 | 7/2003 | Campardo |
| 6,803,782 | B2 | 10/2004 | Koob et al. |
| 6,961,841 | B2 | 11/2005 | Huppenthal et al. |

(Continued)

OTHER PUBLICATIONS

Faezipour et al., "A High-Performance Multi-Match Priority Encoder for TCAM-Based Packet Classifiers," 6th IEEE Dallas Circuits and Systems Workshop on Digital Object Identifier: 10.1109/DCAS. 2007.4433205 Publication Year: 2007 , pp. 1-4.

(Continued)

*Primary Examiner* — Fernando Hidalgo
(74) *Attorney, Agent, or Firm* — David A. Cain; Hoffman Warnick LLC

(57) ABSTRACT

A content-addressable memory (CAM) with computational capability is described. The CAM includes an array of CAM cells arranged in rows and columns with a pair of search lines associated with each column of the array and a match line associated with each row of the array. The array of CAM cells is configured to implement, for a given cycle, either a read operation of data contained in a single selected column, or one of a plurality of different bitwise logical operations on data contained in multiple selected columns. All of the pairs of search lines in the columns of the array are configured to a certain state to implement the read operation or one of the plurality of different bitwise logical operations. A result of the read operation or one of the plurality of different bitwise logical operations is outputted onto all of the match lines in the array.

19 Claims, 11 Drawing Sheets

(56) References Cited

U.S. PATENT DOCUMENTS

| | | | |
|---|---|---|---|
| 6,983,456 | B2 | 1/2006 | Poznanovic et al. |
| 6,996,656 | B2 | 2/2006 | Burton |
| 7,003,593 | B2 | 2/2006 | Huppenthal et al. |
| 7,054,190 | B2 | 5/2006 | Hanyu et al. |
| 7,124,211 | B2 | 10/2006 | Dickson et al. |
| 7,134,120 | B2 | 11/2006 | Hammes |
| 7,155,708 | B2 | 12/2006 | Hammes et al. |
| 7,277,309 | B1 * | 10/2007 | Banachowicz et al. .... 365/49.11 |
| 7,281,085 | B1 | 10/2007 | Garg et al. |
| 7,389,377 | B2 | 6/2008 | Gupta |
| 7,788,445 | B2 | 8/2010 | Pani |
| 8,090,901 | B2 | 1/2012 | Lin et al. |
| 8,117,567 | B2 | 2/2012 | Arsovski |
| 8,891,272 | B2 * | 11/2014 | Wada .......................... 365/49.17 |
| 2006/0176721 | A1 | 8/2006 | Kim et al. |
| 2008/0282015 | A1 * | 11/2008 | Bueti et al. .................... 710/313 |
| 2009/0141566 | A1 * | 6/2009 | Arsovski ................... 365/189.15 |
| 2011/0276752 | A1 | 11/2011 | Kishore |
| 2011/0320693 | A1 | 12/2011 | Assarpour et al. |

OTHER PUBLICATIONS

Dossier ARC920100045: "Programmable regular expression and context free grammar matcher," 2012, 2 pages.

Elliott et al., "A PetaOp/s is Currently Feasible by Computing in RAM," Feb. 1995, 3 pages, PetaFLOPS Frontier Workshop.

* cited by examiner

IMPLEMENTING COMPUTATIONAL MEMORY FROM CONTENT-ADDRESSABLE MEMORY

BACKGROUND

The present invention relates generally to integrated circuit memory devices and, more particularly, to a computational memory implemented from a content addressable memory (CAM) such as a ternary CAM (TCAM).

Existing computer designs typically provide a direct connection between a processor and its associated memory components. In conventional designs, data values are exchanged between the processor and the memory components, which contain load/store addresses and load/store data objects going in and out of the processor.

In order to improve the computational power of processors such as microprocessors, a processing element or arithmetic logic unit (ALU) may be positioned as close as possible to the source of the data (e.g., a memory array) to promote a high data bandwidth between the two structures. Thus, modern microprocessors commonly feature large capacity memories next to the ALU in the form of, for example, L1, L2 and other caches. Although this added memory improves performance, it also increases the die area, and thus, the cost of each microprocessor chip.

Other attempts at increasing the computational speed of a processing element involve placing a one-bit SIMD (Single-Instruction Stream Multiple-Data Stream) processor within the memory circuitry, adjacent to sense amplifiers in both SRAM (Static Random Access Memory) and DRAM (Dynamic Random Access Memory) arrays. However, for small memories, the overhead of this bit-wise ALU approach is high. In addition, the operands need to be read out one at a time, and only then can the result be computed in the ALU attached to the sense-amplifier.

SUMMARY

In one embodiment, a computational memory device is disclosed. The computational memory device comprises an array of content addressable memory (CAM) cells arranged in rows and columns. A pair of search lines is associated with each column of the array and a match line is associated with each row of the array. The array is configured to implement, for a given cycle, either a read operation of data contained in a single selected column, or one of a plurality of different bitwise logical operations on data contained in multiple selected columns. All of the pairs of search lines in the columns of the array are configured to a certain state to implement the read operation or the one of the plurality of different bitwise logical operations. A result of the read operation or the one of the plurality of different bitwise logical operations is outputted onto all of the match lines in the array.

In a second embodiment, a system is disclosed. The system comprises a computational memory including an array of ternary content addressable memory (TCAM) cells arranged in rows and columns, a pair of search lines associated with each column of the array, a match line associated with each row of the array. A search line controller, operatively coupled to the computational memory, is configured to provide an instruction code set to the array that selectively activates certain search lines in the array to perform a read operation of data contained in a single column in the array or one of a plurality of different bitwise logical operations between data in different columns of the array.

In a third embodiment, a method is disclosed. In this embodiment, the method comprises obtaining a matrix of data; transposing the matrix of data; writing the transposed matrix of data into a ternary content addressable memory (TCAM) having a plurality of TCAM cells arranged in an array of rows and columns, a pair of search lines associated with each column in the array, and a match line associated with each row of the array; and selectively activating certain search lines in the array of the TCAM to perform a read operation of data contained in a single column in the array or one of a plurality of different bitwise logical operations between data in different columns in the array.

DETAILED DESCRIPTION

Disclosed herein is an approach for implementing a memory array device with built in computational capability, wherein a physical arithmetic logic unit (ALU) circuit is not necessarily needed to achieve the capability. Rather, the computation is executed as a part of the memory array itself. It is noted, that even further improvements can be achieved by embedding an ALU within the memory and allowing the ALU to benefit from the high internal memory bandwidth. In other words, aspects of the present approach described below can also be combined with existing methods and structures to achieve even more complex operations than simple bitwise logical operations.

Briefly stated, a novel memory cell structure and supporting architecture effectively allows for the implementation of a "distributed ALU" across the memory array. This new cell and architecture allows an even more powerful processing element which executes the logical operation concurrently with the read operation. Furthermore, this new cell and architecture allows the ability to perform bitwise operations on more than one operand of the memory. By modifying the memory cell as described hereinafter, as well as the read support circuitry, the memory can perform bitwise logical operations such as "OR" and "AND" on multiple words concurrently, and even more complex functions. Through execution of these operations, the processing element can technically implement any logical function on any combination of stored words in the memory array.

Figure 1:
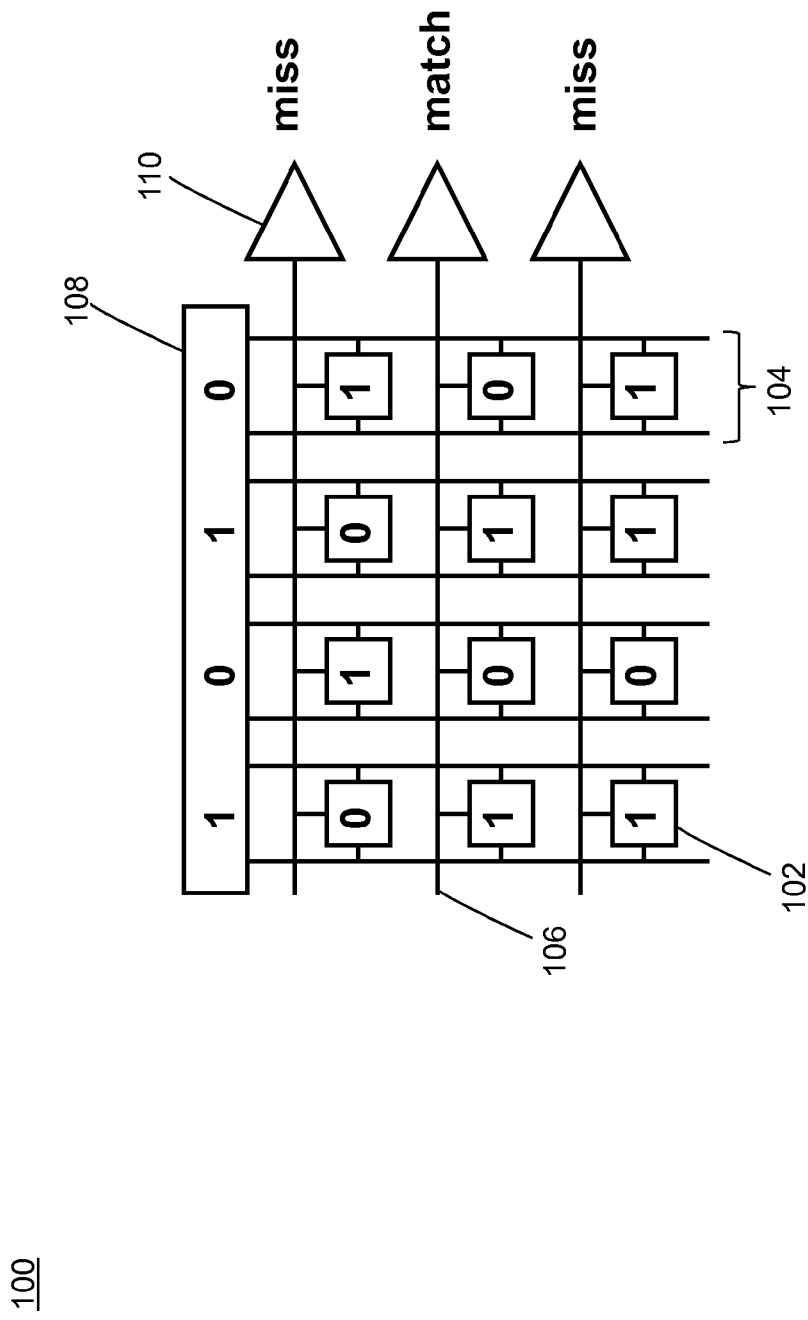
FIG. 1 is a schematic diagram illustrating operation of a conventional content addressable memory (CAM)

FIG. 1 is a schematic diagram illustrating operation of a conventional content addressable memory (CAM) 100. In FIG. 1, CAM 100 comprises an array of individual CAM cells 102 arranged into rows and columns each having comparison circuitry to enable a search operation to complete in a single clock cycle. A pair of search lines 104 is associated with each column of the array, while a match line 106 is associated with each row of the array. In operation, the pairs of search lines 104 place or broadcast search data 108 to CAM cells 102, while match lines 106 indicate via a match line sense amplifier 110 whether search data 108 matches the words in the rows associated with the match lines. Although not shown in this figure, the match lines 106 and their respective match line sense amplifiers 110 could be inputted to an encoder that generates the address in CAM 100 corresponding to any location that matches search data 108.

In the example depicted in FIG. 1, CAM 100 is a 3×4 bit binary CAM. CAM 100 is a binary type since it supports storage and searching of binary bits (i.e., a logical 0 or a logical 1). In particular, individual CAM cells 102 are arranged into three horizontal words, each four bits long. In this example, search data 1010 is broadcast into each of the rows of the array of CAM cells 102 via the pairs of search lines 104. The word in the second row of the array of CAM cells 102 matches search data 1010. This causes this row's match line 106 to activate and indicate a match. The words in the first row and the second row of the array of CAM cells 102 do not match search data 1010. As a result, the match lines 106 of these rows are deactivated to indicate a miss. An encoder coupled to the match lines 106 and the match line sense amplifiers 110 would then generate the address of the second row in CAM 100 as a match location. This capability of receiving search data as input and fetching back the address where the content is found makes binary CAMs useful for a multitude of applications such as networking and data compression.

Figure 2:
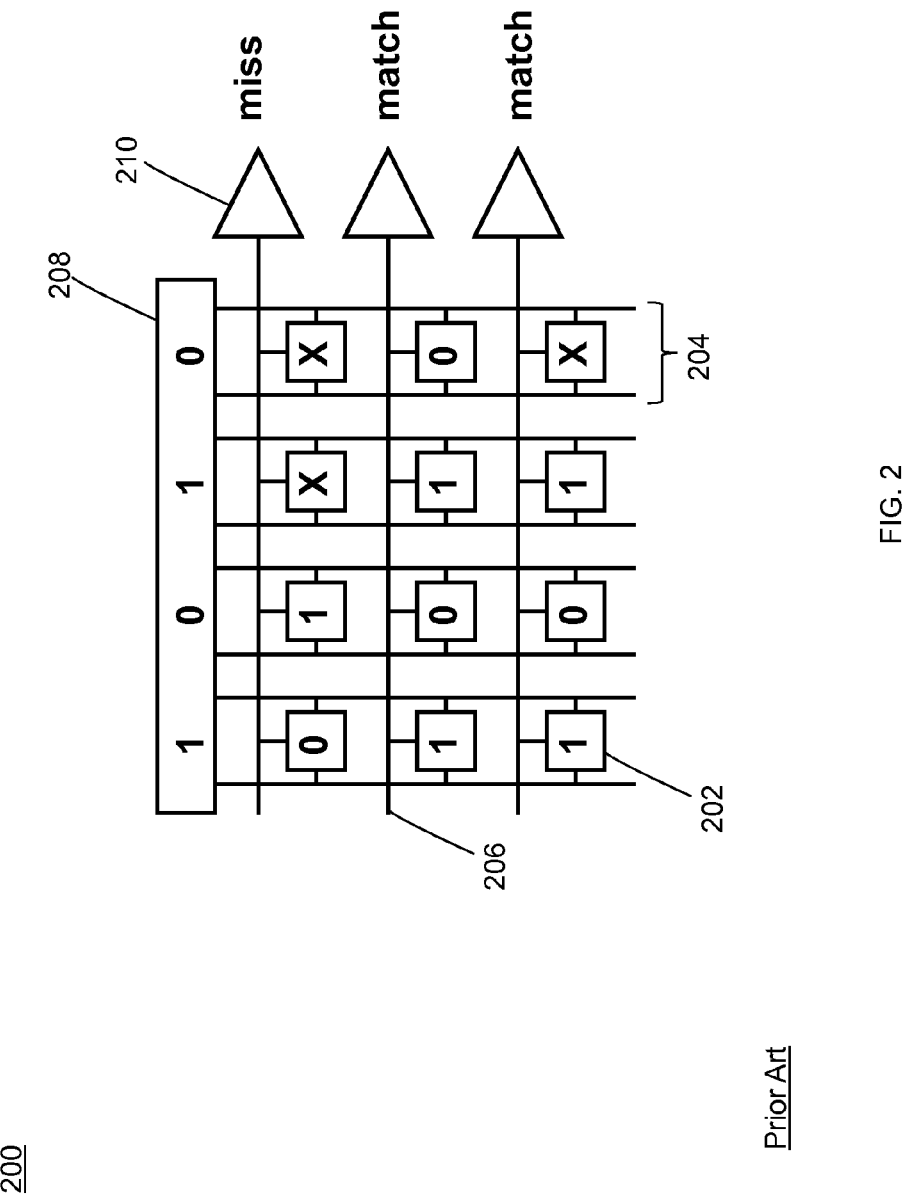
FIG. 2 is a schematic diagram illustrating operation of a conventional ternary content addressable memory (TCAM)

A ternary CAM (TCAM) is another example of a CAM that can receive search data as input and fetch back the address indicating where the content is found. FIG. 2 is a schematic diagram illustrating operation of a conventional TCAM 200. TCAM 200 comprises an array of individual TCAM cells 202 arranged into rows and columns each having comparison circuitry to enable a search operation to complete in a single clock cycle. A pair of search lines 204 is associated with each column of the array, while a match line 206 is associated with each row of the array. The pairs of search lines 204 broadcast search data 208 to TCAM cells 202, while match lines 206 indicate via a match line sense amplifier 210 whether search data 208 matches the words in the rows associated with the match lines. Although not shown in this figure, the match lines 206 and their respective match line sense amplifiers 210 could be inputted to an encoder that generates the address in TCAM 200 corresponding to any location that matches search data 208.

TCAM 200 differs from CAM 100 in that it supports storing a logical 0, a logical 1, or a "don't care" bit (X) that matches with either a logical 0 or a logical 1. In FIG. 2, TCAM 200 is a 3×4 TCAM having individual TCAM cells 202 arranged into three horizontal words, each four bits long. In this example, 01XX is the word in the top row of the array of TCAM cells, 1010 is the word in the middle row, and 101X is the word in the bottom row. Search data 1010 is broadcast into each of the rows of the array of TCAM cells 202 via the pairs of search lines 204. The word in the second and third rows of the array of TCAM cells 202 matches search data 1010. Note that search data 1010 matches with the word 101X in the third row because the don't care bit X matches with either a logical 0 or a logical 1 (i.e., a don't care bit is similar to a wildcard). The matches with the words in the second and third rows cause their match lines 206 to activate and indicate a match. The word in the first row of the array of TCAM cells 202 does not match search data 1010 despite this row having don't care bits. As a result, the match line 206 of this row is deactivated to indicate a miss. An encoder coupled to the match lines 206 and the match line sense amplifiers 210 would then generate the address of the second and third rows in TCAM 200 as match locations.

Figure 3:
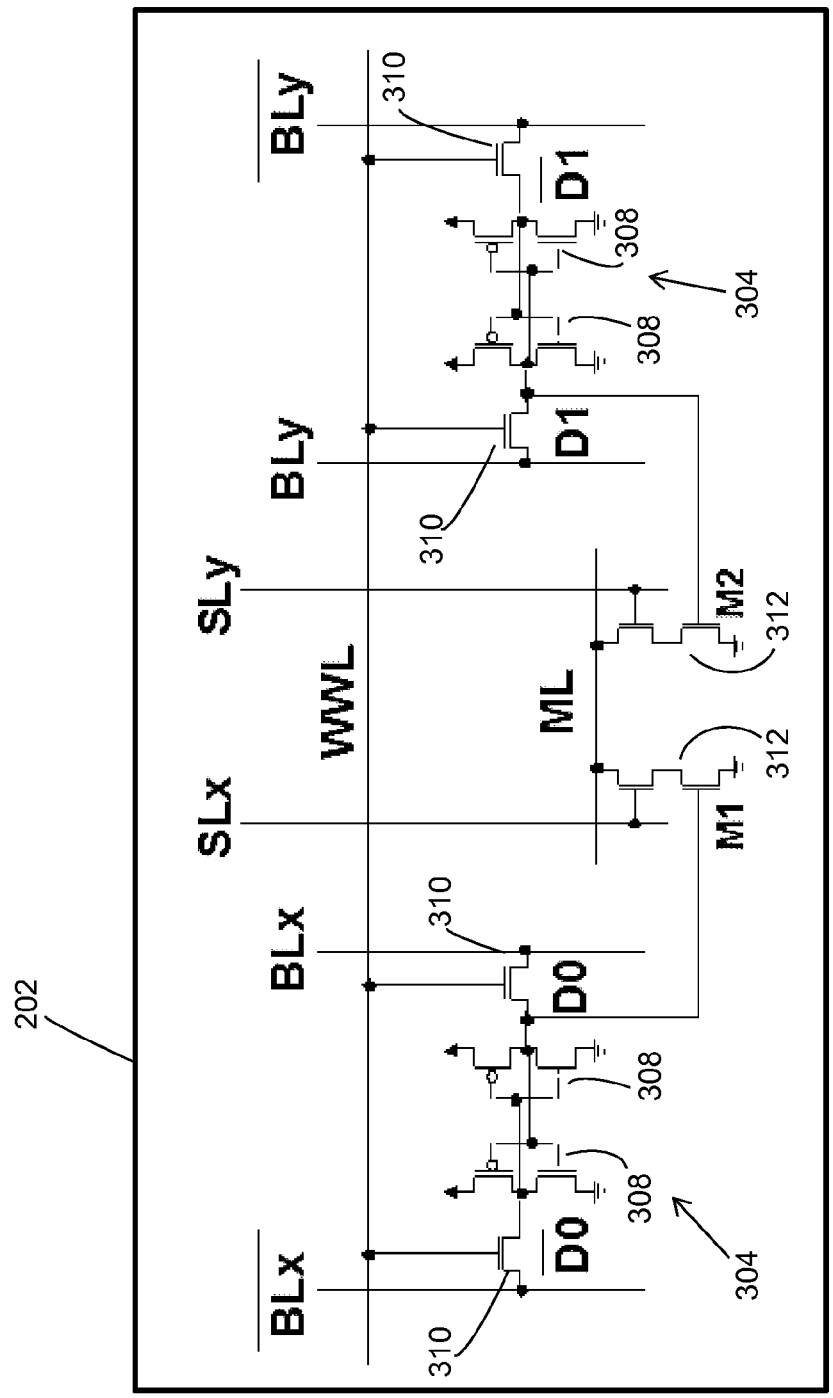
FIG. 3 is a schematic circuit diagram illustrating one possible structure of a 16-transistor TCAM cell that can be used in the TCAM depicted in FIG. 2.

FIG. 3 is a schematic circuit diagram illustrating an example of one possible structure for one of the TCAM cells 202 depicted in FIG. 2. In the example illustrated in FIG. 3, the structure for TCAM cell 202 is NOR-based. Those skilled in the art will appreciate that other types of TCAM cells exist (e.g., NAND-based). The various embodiments described herein are suitable for use with these other TCAM cell structures and should not be limited to any particular one structure.

In FIG. 3, TCAM cell 202 comprises a 16-transistor (16T) structure having a pair of SRAM storage elements 304 each configured to store a data bit D and a complement data bit $\overline{D}$. Each storage element 304 comprises a 6-transistor (6T) having a pair a cross coupled CMOS inverters 308 and a pair of access transistors 310 each coupled to one of the inverters. The pair of access transistors 310 are activated by a write word line (WWL). When activated by WWL, the pair of access transistors 310 couples cell data from a bit line pair BL and $\overline{BL}$ onto a 4-transistor (4T) storage latch formed from the cross-coupled inverters 308. Note that for the 6T storage element 304 on the left-hand side of FIG. 3, bit lines BLx and $\overline{BLx}$ connect to the access transistors 310 associated with the true data bit D0 and the complement data bit $\overline{D0}$, respectively. Bit lines BLy and $\overline{BLy}$ associated with the 6T storage element 304 on the right-hand side of FIG. 3 connect respectively with the true data bit D1 and the complement data bit $\overline{D1}$ via the access transistors 310. Those skilled in the art will appreciate that 6T storage elements can be implemented using multiple different types of memories such as SRAM, DRAM, non-volatile RAM, etc.

A first NFET stack 312 (M1) formed from a pair of NFET transistors connects to the storage element 304 on the left-hand side of the 16T structure, while a second NFET stack 312 (M2) formed from another pair of NFET transistors connects to the storage element 304 on the right-hand side of the 16T structure. As shown in FIG. 3, the gate of the bottom NFET in stack M1 connects to the true data bit D0 node of storage element 304 on the left-hand side of the 16T structure, while the gate of the bottom NFET in stack M2 connects to the true data bit D1 node of storage element 304 on the right-hand side of the 16T structure. A pair of search lines SLx and SLy connect with the NFET stacks 312. In particular, search line SLx connects to the gate of the top NFET in M1, while search line SLy connects to the gate of the top NFET in M2. A match line ML for the cell also connects with the top NFET in M1 and the top NFET in M2 through the drains of each transistor. In this manner, the 6T storage element 304 and the 2 transistor (2T) NFET stack on the left-hand side of the 16T structure form an eight-transistor (8T) TCAM half-cell, while the 6T storage element 304 and the 2T NFET stack on the right-hand side of the 16T structure form another 8T TCAM half cell; both 8T TCAM half cells form the 16T structure of TCAM cell 202. Those skilled in the art will appreciate that the data bit and search line gate connections on the NFET stacks could be swapped in different TCAM implementations.

During a TCAM search operation, match line ML is precharged high putting it temporarily in a match state. Next, the search lines SLx and SLy broadcast search data to TCAM cell to determine if there is a match with the data in storage elements 304. Each 8T TCAM half cell will then compare its stored bit against the bit on its corresponding search lines SLx and SLy. Cells with matching data do not affect the match line ML, however, cells that mismatch or miss in matching with the search data will discharge or pull-down the match line ML to ground.

Table 1 illustrates a state of values for representing data within TCAM cell 202.

TABLE 1

| D0 | D1 | D |
|---|---|---|
| 0 | 1 | 0 |
| 1 | 0 | 1 |
| 0 | 0 | X |
| 1 | 1 | Invalid |

Per Table 1, if TCAM cell 202 is storing a logical 0, then D0 contains a logical 0, $\overline{D0}$ contains a logical 1, D1 contains a logical 1, $\overline{D1}$ contains a logical 0. If TCAM cell 202 is storing a logical 1, then D0 contains a logical 1, $\overline{D0}$ contains a logical 0, D1 contains a logical 0, and $\overline{D1}$ contains a logical 1. If TCAM cell 202 is storing a don't care bit (X), then D0 contains a logical 0, $\overline{D0}$ contains a logical 1, D1 contains a logical 0, and $\overline{D1}$ contains a logical 1. Note that per Table 1, it is not possible for D0 and D1 to concurrently store a logical 1.

Table 2 illustrates a state of values for representing search data that is broadcast to TCAM cell 202 to determine if there is a match.

TABLE 2

| SLx | SLy | S |
|---|---|---|
| 1 | 0 | 0 |
| 0 | 1 | 1 |
| 0 | 0 | X |
| 1 | 1 | Invalid |

Per Table 2, if search data S is broadcasting a logical 0 into TCAM cell 202, then SLx is a logical 1 and SLy is a logical 0. If search data S is broadcasting a logical 1 into TCAM cell 202, then SLx is a logical 0 and SLy is a logical 1. If search data S is broadcasting a don't care bit (X) into TCAM cell 202, then SLx is a logical 0 and SLy is a logical 0. Note that per Table 2, it is not possible for SLx and SLy to simultaneously supply a logical 1.

As an example, assume that TCAM cell 202 is storing a logical 1 and that search data supplied to TCAM cell 202 is a logical 0. Using Tables 1 and 2, D0 contains a logical 1, D1 contains a logical 0, SLx is a logical 1, and SLy is a logical 0. In this example, the bottom NFET in M2 will not be active because its gate is coupled to the D1 node which is a logical 0. As a result, ML will not be pulled down or discharged to ground because the bottom NFET in M2 is not activated. However, the bottom NFET in M1 will be active because its gate is coupled to the D0 node which is a logical 1. This will discharge the precharged ML to ground because the bottom NFET in M1 is activated by the D1 node. Pulling down ML to ground is indicative of a miss between the search data value 0 and the data value 1 stored in TCAM cell 202.

In another example, assuming that search data supplied to TCAM cell 202 is a logical 1 and that TCAM cell 202 is storing a logical 1. Using Tables 1 and 2, D0 contains a logical 1, D1 contains a logical 0, SLx is a logical 0, and SLy is a logical 1. In this example, the bottom NFET in M1 will be active because its gate is coupled to the D0 node which is a logical 1. ML will not be pulled down or discharged to ground in this instance because the top NFET in M1 is not activated since SLx is a logical 0. The bottom NFET in M2 will not be active because its gate is coupled to the D1 node which is a logical 0. Even though the top NFET in M2 is active since SLy is a logical 1, ML will not be discharged because the bottom NFET in M2 is inactive. Since ML will not be discharged, it will essentially maintain its precharged high level. Keeping ML at its precharged level is an indication that there is a match between the search data value 1 and the data value 1 stored in TCAM cell 202.

In another example, assume that TCAM cell 202 is storing a don't care bit (X) and that the search data supplied to TCAM cell 202 is a logical 1. Using Tables 1 and 2, D0 contains a logical 0, D1 contains a logical 0, SLx is a logical 0, and SLy is a logical 1. In this example, the bottom NFETs in both M1 and M2 will be inactive because their gates are coupled to the D0 and D1 nodes which are both a logical 0. As a result, ML will not be pulled down or discharged to ground because the bottom NFETs in both M1 and M2 are inactive. The values provided by SLx and SLy will have no bearing on discharging ML. Keeping ML at its precharged high level is an indication that there is a match between the search data value 1 and the don't care bit X stored in TCAM cell 202.

For sake of clarity, FIG. 3 only describes the operation of one TCAM cell 202 in TCAM 200 of FIG. 2. Those skilled in the art will appreciate that during a TCAM search operation, all MLs in the TCAM are precharged high. This would include all TCAM cells in the same row as the cell depicted in FIG. 2 as well as all of the other cells in the array. The search data would be broadcast into each of the cells in the rows of the array of TCAM cells 202 via the pairs of search lines 204 in the manner described above. Word in any rows of the TCAM that match search data will generate a match through the rows' match lines, while any mismatches will generate a miss through the match lines. An encoder coupled to the match lines and the match line sense amplifiers could then generate the address of any rows in the TCAM that match the search data.

Figure 4:
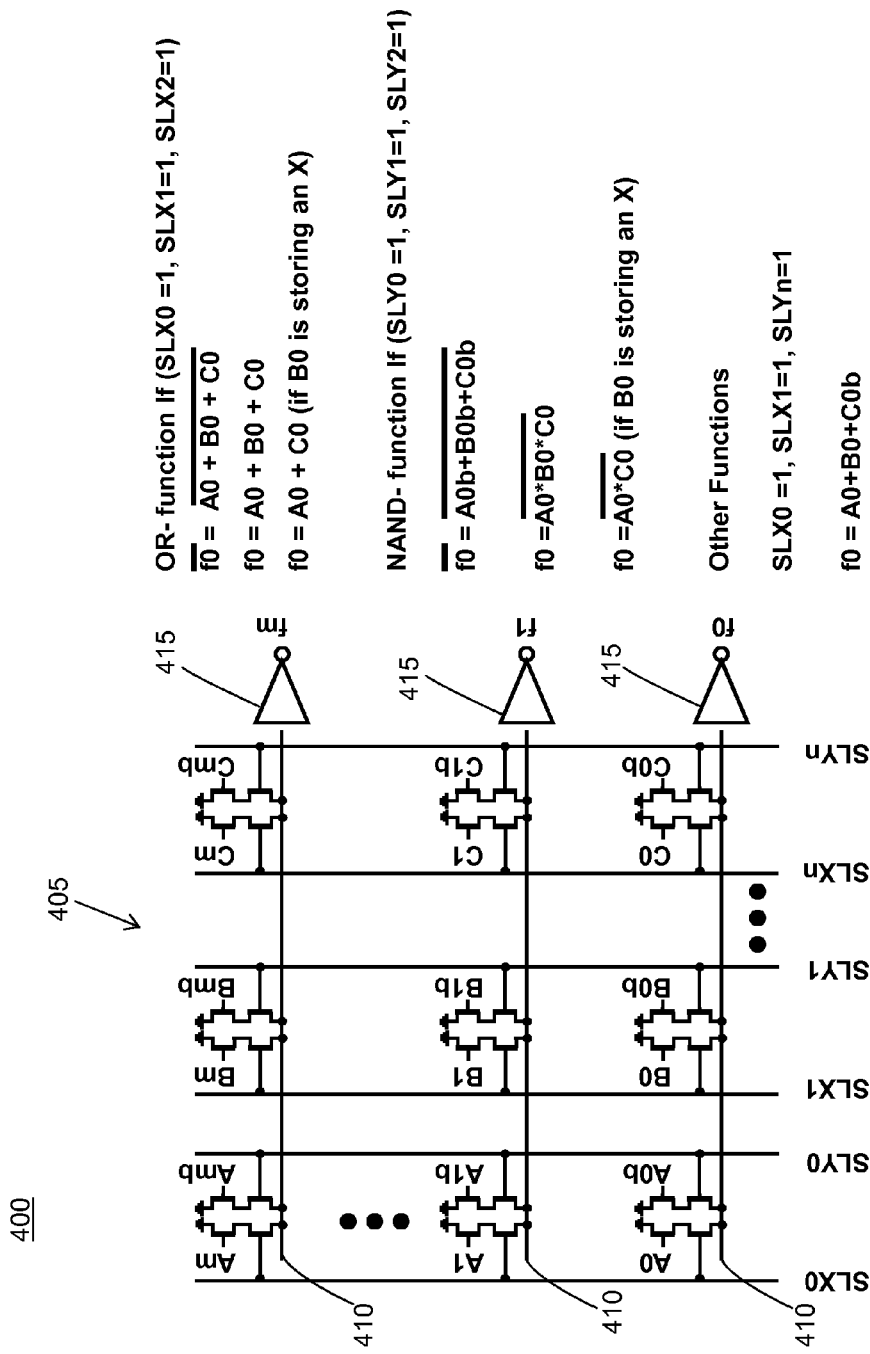
FIG. 4 is a schematic circuit diagram illustrating operation of a computational memory implemented from a TCAM according to one embodiment of the present invention.

FIG. 4 is a schematic circuit diagram illustrating how a computational memory 400 can be implemented from a TCAM 405 according to one embodiment of the present invention. TCAM 400 comprises an array of individual TCAM cells arranged into rows and columns each having comparison circuitry, a pair of search lines associated with the column in the array that the cell resides, and a match line associated with the row in the array that the cell resides, like the one depicted in FIG. 3. For clarity, FIG. 4 only illustrates the TCAM cells of TCAM 400 with the comparison circuitry, the pairs of search lines and the match lines. In particular, each TCAM cell of TCAM 400 is shown with the two pairs of NFET stacks used as the comparison circuitry. For example, NFET stacks A0 and A0b, A1 and A1b, and Am and Amb correspond to the data-bits supplied from the two TCAM cell storage nodes (D0, D1) shown in FIG. 3 to the two pairs of NFET stacks for the cells in the first column starting from the left-hand side of TCAM 400 and extending upward, respectively. Search line pairs SLX0 and SLY0 broadcast search data to the cells in the first column, search line pairs SLX1 and SLY1 broadcast search data to the cells in the next column and search line pairs SLXn and SLYn broadcast search data to the cells in the last column. Match lines 410 are shown extending through each of the TCAM cells in a row of TCAM 400 and are used in conjunction with inverters 415 to indicate matches and misses with search data supplied to the TCAM.

The search line pairs (e.g., SLX0 and SLY0, SLX1 and SLY1; SLXn and SLYn) can be controlled in a manner that enables TCAM 400 to operate as a computational memory. As used herein, a computational memory is generally a memory that can perform read and write operations and bitwise logical operations between data in different columns of TCAM 400. A logical OR bitwise operation can be performed between columns in TCAM 400 by activating more than one search line from the pairs of search line. For example, an OR operation can be attained by activating the first search line (e.g., SLX0, SLX1, SLXn) from at least two of the search line pairs for TCAM 400. In a scenario where SLX0, SLX1 and SLXn are simultaneously activated, for any given row, the associated match line will be discharged if any of the associated row bits in the cell's storage elements are a logical 1. In this example, the bit values (e.g., A0, B0, C0) coupled to the gates of the NFETs in the NFET stacks that connect with ground correspond to the true nodes of the SRAM storage cells in the TCAM cells (e.g., see D0 and D1 in FIG. 3). By inverting the outputs on each match line, the following expressions hold:

$\overline{f0} = \overline{A0+B0+C0}$; and $f0 = A0+B0+C0$.

However, if one of the cells is storing a don't care bit X such as B0, then the above expression reduces to:

$f0 = A0+C0$.

Expressions for f1 and fm would be similar to those described for f0. In particular, fb 1=A1+B1+C1 and fm=Am+Bm+Cm.

By using both of the true nodes of the storage cells in the TCAM cells (e.g., see D0 and D1 in FIG. 3), there is the added capability of generating bitwise NAND functionality for columns of bits due to the negation principle of DeMorgan's theorem, which recognizes that: not (A and B)=(not (A) or not (B)). As described above, a logical OR operation may be performed for the true value of the row bits of each selected column by activating the first search line of the pairs of search lines SLX0, SLX1, ..., SLXn. In addition, by activating the second search line of the pairs of search lines SLY0, SLY1, ..., SLYn, associated with the other true node of the storage elements cells of the TCAM cell bits (e.g., A0b, B0b, C0B, etc.), a logical OR operation of the complement data values will occur. This is expressed as:

$\overline{f0} = \overline{A0b+B0b+C0b}$;

which is the logical equivalent of the expression:

$f0 = \overline{A0}*\overline{B0}*\overline{C0}$;

which is the equivalent of a NAND operation of the true data values. Note that the expression can be further reduced to:

$f0 = \overline{A0}*\overline{C0}$ when B0 stores a "don't care" state.

Having the capability to perform logical OR and NAND operations enables computational memory 400 to also perform additional bitwise logical operations. In particular, additional bitwise logical operations can be performed on selected bits within a given row by activation of either the first or second of the search lines from the search line pairs in each column. For example, as listed in FIG. 4, a NOR and AND operation can be performed by activating search lines SLX0, SLX1 and SLYn.

Figure 5:
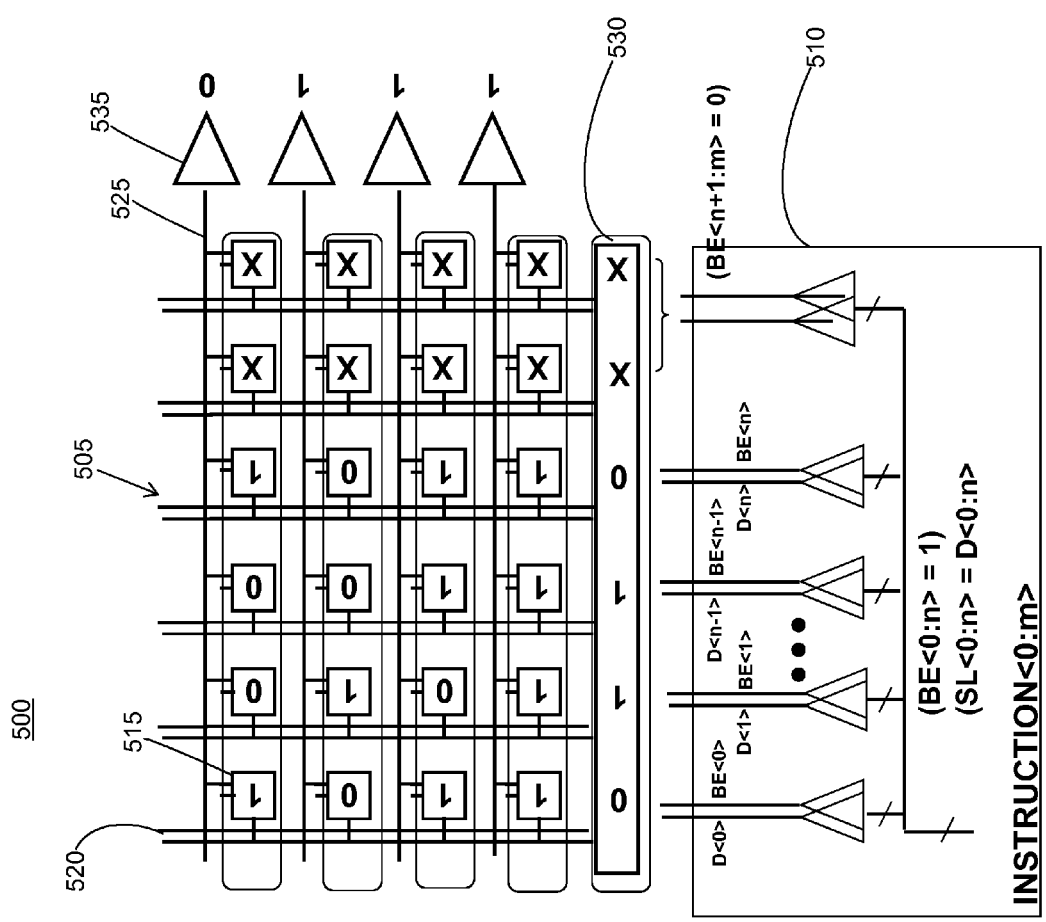
FIG. 5 is a schematic diagram illustrating a system including a computational memory implemented from a TCAM with a search line controller that provides an instruction control set to the computational memory that implements either a read operation of data contained in a column of the TCAM or a bitwise logical operation on data contained in multiple columns of the TCAM according to one embodiment of the present invention.

FIG. 5 is a schematic diagram illustrating a system 500 including a computational memory implemented from a TCAM 505 with a search line controller 510 that provides an instruction control set to the computational memory that implements either a read operation of data contained in a column of TCAM 505 or a bitwise logical operation on data contained in multiple columns of the TCAM 505 according to one embodiment of the present invention. TCAM 505 comprises an array of individual TCAM cells 515 arranged into rows and columns each having comparison circuitry to enable a search operation. A pair of search lines 520 is associated with each column of the array, while a match line 525 is associated with each row of the array. The pairs of search lines 520 broadcast search data 530 to TCAM cells 515, while match lines 525 indicate via a match line sense amplifier 535 whether search data 530 matches the words in the rows associated with the match lines.

As a computational memory, the pairs of search lines 520 are used to configure TCAM 505 to perform a certain bitwise logical operation. In particular, activating or deactivating each of the pairs of search lines 520 in a certain manner enables TCAM 505 to act as a computational memory and perform bitwise logical operations. For example, TCAM 505 can be used to perform OR operations, NAND operations and combinations of OR and NAND operations by configuring the pairs of search lines in the manner discussed above. Results of any bitwise logical operations performed by TCAM 505 are developed along match lines 525 and match line sense amplifiers 535.

Search line controller 510 provides the instruction control set to TCAM 505 in the form of search data 530 that is used to control the configuring of the pairs of search lines 520. In one embodiment, the instruction code comprises a data bit (D) and a bit enable (BE) for each of the pairs of search lines 520. Search line controller 510 directs each data bit D and bit enable BE to a pair of search lines 520. Each data bit D and bit enable BE dictate how the pairs of search lines 520 will be controlled to broadcast certain search data that facilitates a particular bitwise logical operation between columns of TCAM cells in TCAM 505. In one embodiment, as shown in FIG. 5, the instruction code set has a width defined as <0 μm>, such that data bit D<0 > and bit enable BE<0> controls the pairs of search lines for the first column in the array of TCAM 505, data bit D<1 > and bit enable BE<1 > controls the pairs of search lines for the second column, data bit D<n−1 > and bit enable BE<n−1 > controls the pairs of search lines for the n−1 column, and data bit D<n> and bit enable BE<n> controls the pairs of search lines for the n column. Note that each column in TCAM 505 that contains don't care bits (X) are only controlled by a bit enable BE (i.e., BE<n+1:m>).

TCAM 505 translates each data bit D and bit enable BE onto the pairs of search lines in accordance with the following set of rules:

When a bit enable BE is a logical 0, then the entire column is masked from the search operation. A bit enable BE that is a logical 0 results in a logical 0 on both search lines of a search pair, effectively resulting in a don't care. Therefore, regardless of whether data bit D is a logical 0 or a logical 1, both of the pairs of search lines (i.e., SLX and SLY) in a column of the TCAM 505 will be a logical 0 whenever bit enable BE is a logical 0. Note that search line controller 510 will generate a bit enable BE that is a logical 0 to the last two columns of TCAM 505 that are filled with don't care bits (X).

When a bit enable BE is a logical 1, then the data input specified by data bit D will control the state of the pairs of search lines (i.e., active or inactive). In one embodiment, a data bit D that is a logical 1 will cause the first search line (i.e., SLX) of a pair of search lines to be activated through a logical 1, while the second search line (i.e., SLY) of the pair will be inactive through a logical 0. A data bit D that is a logical 0 will cause the first search line (i.e., SLX) of a pair of search lines to be inactive through a logical 0, while the second search line (i.e., SLY) of the pair will be active through a logical 1.

The above rules are only illustrative of one approach in encoding data bit D and bit enable BE. Those skilled in the art will appreciate that other approaches can be used to encode data bit D and bit enable BE in order to control the pairs of search lines to perform a variety of Boolean bitwise logical operations.

Applying the above rules to the example illustrated in FIG. 5 where 0110XX is the search data broadcast to TCAM 505, results in search line controller 510 generating an instruction control set that comprises:

$D<0>=0$ and $BE<0>=1$;

$D<1>=1$ and $BE<1>=1$;

$D<n-1>=1$ and $BE<n-1>=1$;

$D<n>=0$ and $BE<n>=1$; and $BE<n+1:m>=0$

Generating such an instruction control set results in 0110XX being the search data 530 applied to TCAM 505. In this example, 0110XX causes TCAM 505 to perform a bitwise logical operation that is a combination of a NOR operation and an AND operation. Essentially, in this bitwise logical operation, the bits in the columns that are being broadcast a logical 0 are flipped to their complement. Thus, bits in the first column on the left-hand side of TCAM 505 starting from the bottom will change from 1101 to 0010, while bits in the fourth column from the left-hand side of TCAM 505 starting from the bottom will change from 1101 to 0010. With these changes to the noted columns, an OR of all of the bits across each row results in TCAM 505 generating a 1110 along match lines 525 (starting from the bottom).

Figure 6:
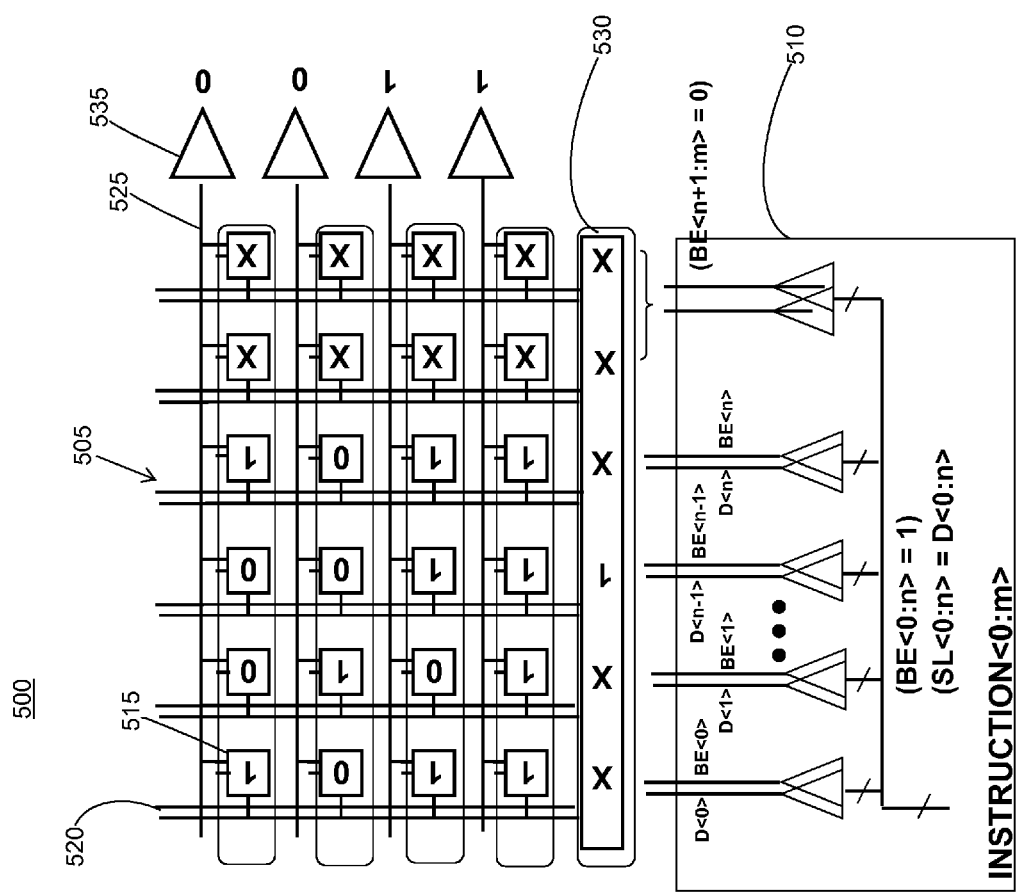
FIG. 6 is a schematic diagram illustrating a computational memory implemented from a TCAM performing a read operation on a selected column according to one embodiment of the present invention.

FIG. 6 is a schematic diagram illustrating how a computational memory like the one shown in FIG. 5 can be used to perform other operations. For example, FIG. 6 discloses TCAM 505 and search line controller 510 performing a read operation. In this example, search line controller 510 issues an instruction control set that results in XX1XXX as the search data 530 that is broadcast to the columns in TCAM 505 through respective pairs of search lines 520. A don't care bit X is generated for every column except for column three (starting from the left-hand side of TCAM 505). In this case, the instruction control set generated from search line controller 510 would have a bit enable BE set to logical 0 for BE<0 >, BE<1 >, BE<n> and BE<N+1:m>, and a data bit D set to logical 1 and a bit enable BE set to logical 1 for D<n-1> and BE<n-1>, respectively. An instruction control set of XX1XXX causes TCAM 505 to read the data bits in the third column. Hence, 1100 is outputted along match lines 525 (starting from the bottom). Note that another operation could be implemented by having a logical 0 on D<n-1> and B<n-1>, which would read the NOT of the stored word.

Figure 7:
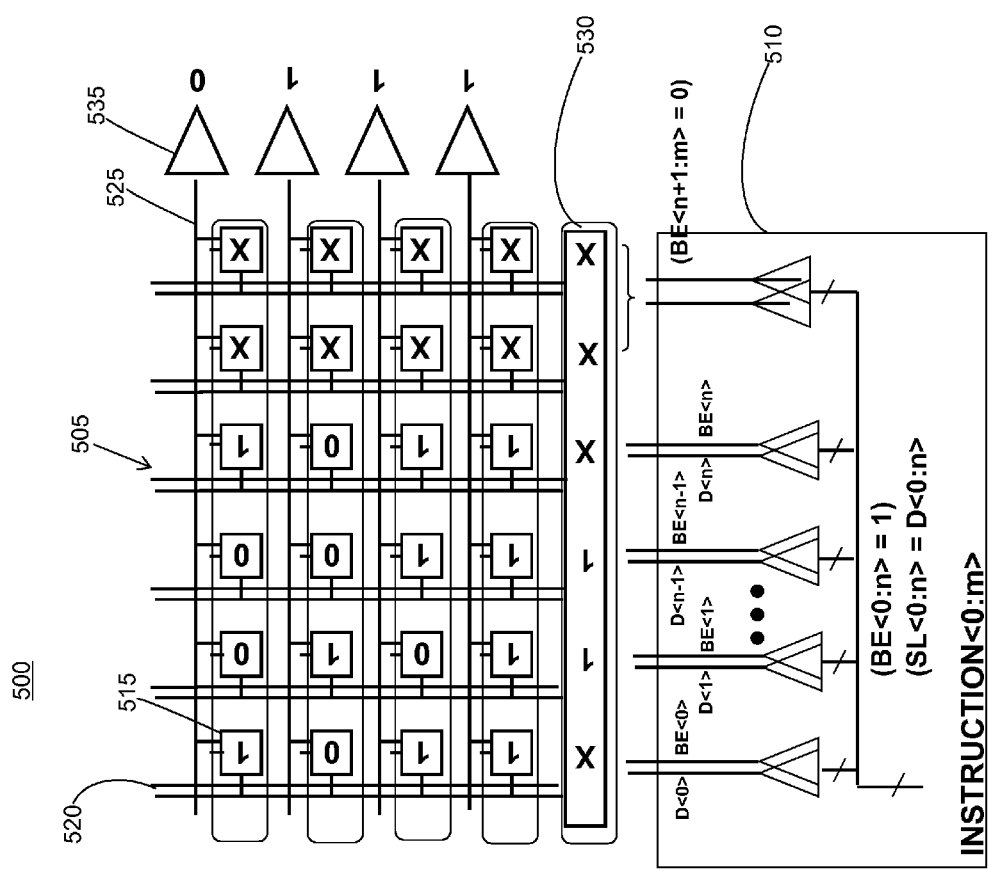
FIG. 7 is a schematic diagram illustrating a computational memory implemented from a TCAM performing an OR operation on a multiple of selected columns according to one embodiment of the present invention.

FIG. 7 is a schematic diagram illustrating how a computational memory like the one shown in FIG. 5 can be used to perform other bitwise logical operations. For example, FIG. 7 discloses TCAM 505 and search line controller 510 performing an OR operation. In this example, search line controller 510 issues an instruction control set that results in X11XXX as the search data 530 that is broadcast to the columns in TCAM 505 through respective pairs of search lines 520. A don't care bit X is generated for every column except for columns two and three (starting from the left-hand side of TCAM 505). In this case, the instruction control set generated from search line controller 510 would have a bit enable BE set to logical 0 for BE<0>, BE<n> and BE<N+1:m>, a data bit D set to logical 1 and a bit enable BE set to logical 1 for D<1> and BE<1>, respectively, and a data bit D set to logical 1 and a bit enable BE set to logical 1 for D<n-1> and BE<n-1>, respectively. An instruction control set of X11XXX causes TCAM 505 to act as a computational memory and perform an OR between columns 2 and 3. In this example, 1110 is outputted along match lines 525 (starting from the bottom).

Figure 8:
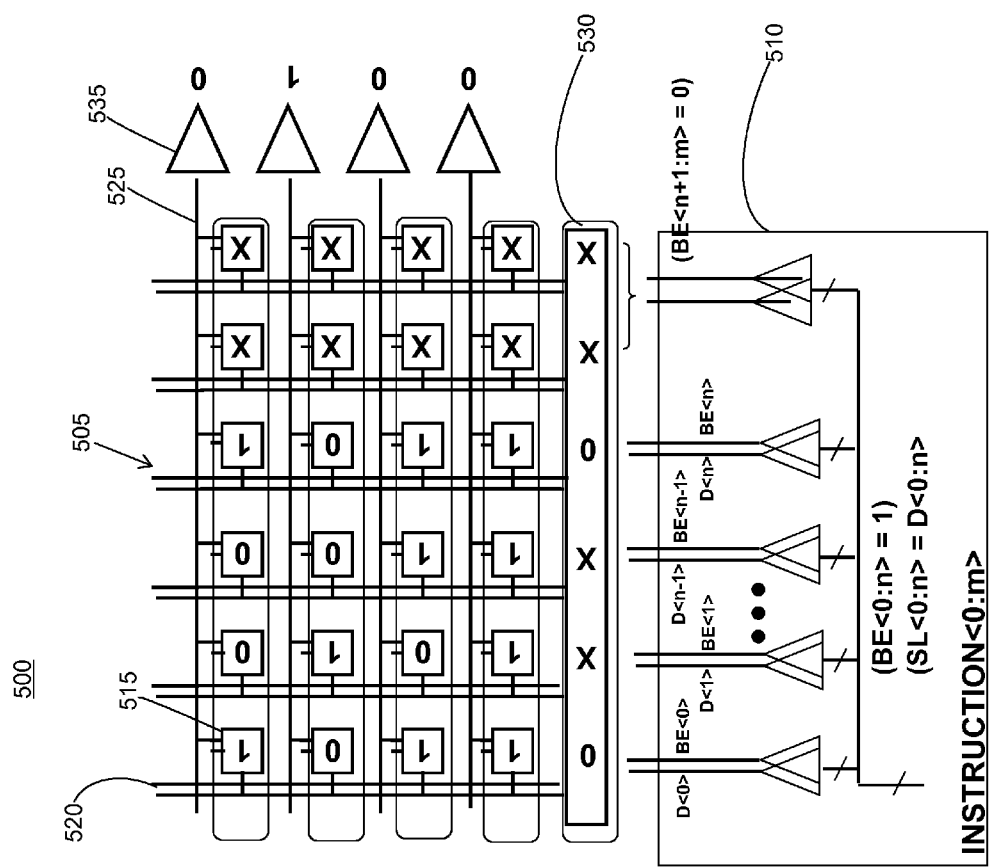
FIG. 8 is a schematic diagram illustrating a computational memory implemented from a TCAM performing a NAND operation on a multiple of selected columns according to one embodiment of the present invention.

FIG. 8 is a schematic diagram illustrating how a computational memory like the one shown in FIG. 5 can be used to perform another bitwise logical operation such as a NAND operation. In this example, search line controller 510 issues an instruction control set that results in 0XX0XX as the search data 530 that is broadcast to the columns in TCAM 505 through respective pairs of search lines 520. A don't care bit X is generated for every column except for the first and fourth columns (starting from the left-hand side of TCAM 505). In this case, the instruction control set generated from search line controller 510 would have a bit enable BE set to logical 0 for BE<1>, BE<n-1> and BE<N+1:m>, a data bit D set to logical 0 and a bit enable BE set to logical 1 for D<0> and BE<0>, respectively, and a data bit D set to logical 0 and a bit enable BE set to logical 1 for D<n> and BE<n>, respectively. An instruction control set of 0XX0XX causes TCAM 505 to act as a computational memory and perform a NAND between columns 1 and 4. In this example, 0010 is outputted along match lines 525 (starting from the bottom).

Figure 9:
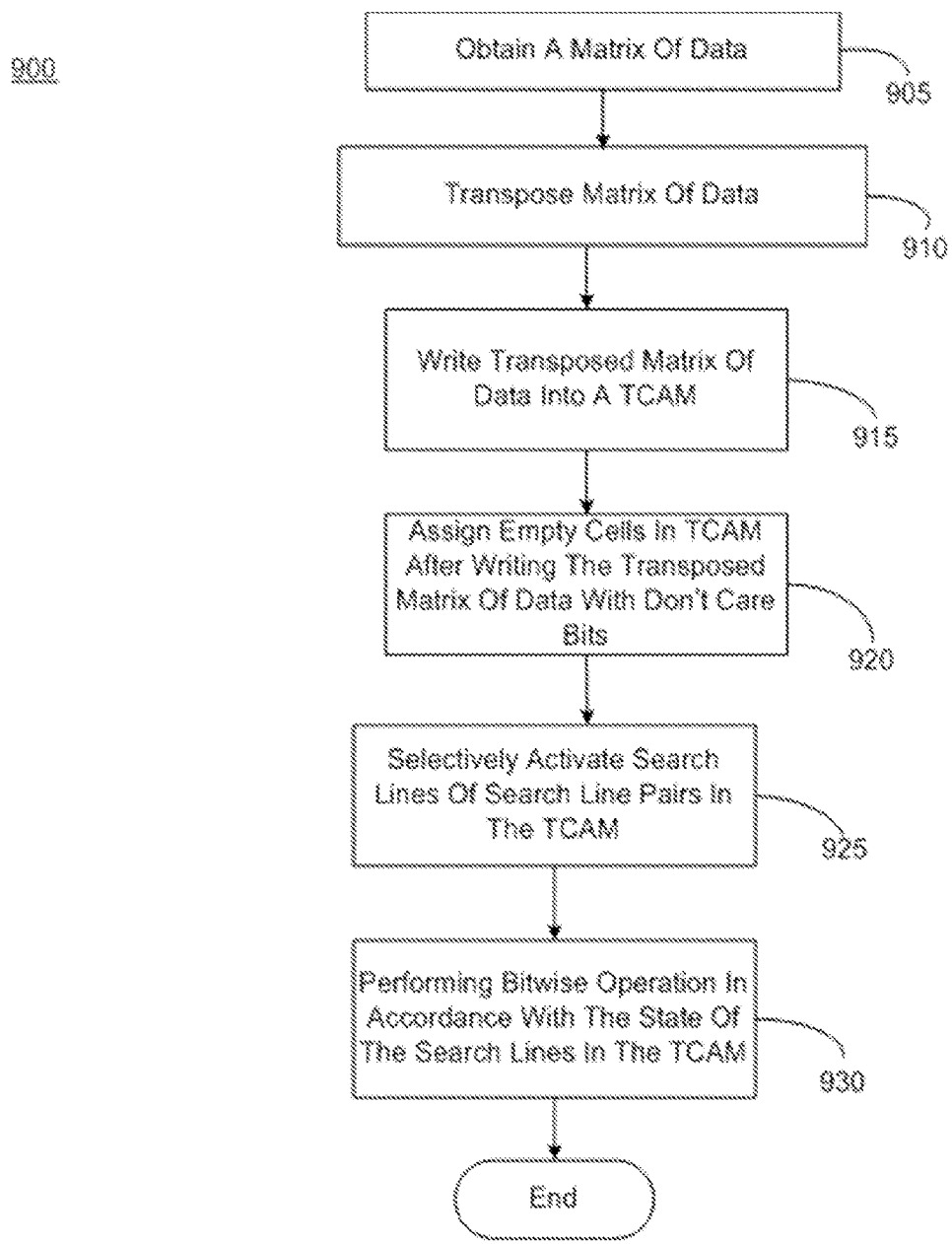
FIG. 9 is a flow chart describing a method of implementing a computational memory from a TCAM according to one embodiment of the invention.

FIG. 9 is a flow chart 900 describing a method of implementing a computational memory from a TCAM according to one embodiment of the invention. In FIG. 9, operations begin at 905 by obtaining a matrix of data that is to be used as the computational memory. Next, the matrix of data is transposed at 910 and then written into a TCAM at 915. Cells in the rows and columns of the TCAM that are unfilled or empty after loading the TCAM with the transposed data are then assigned don't care bits X at 920.

Figure 10:
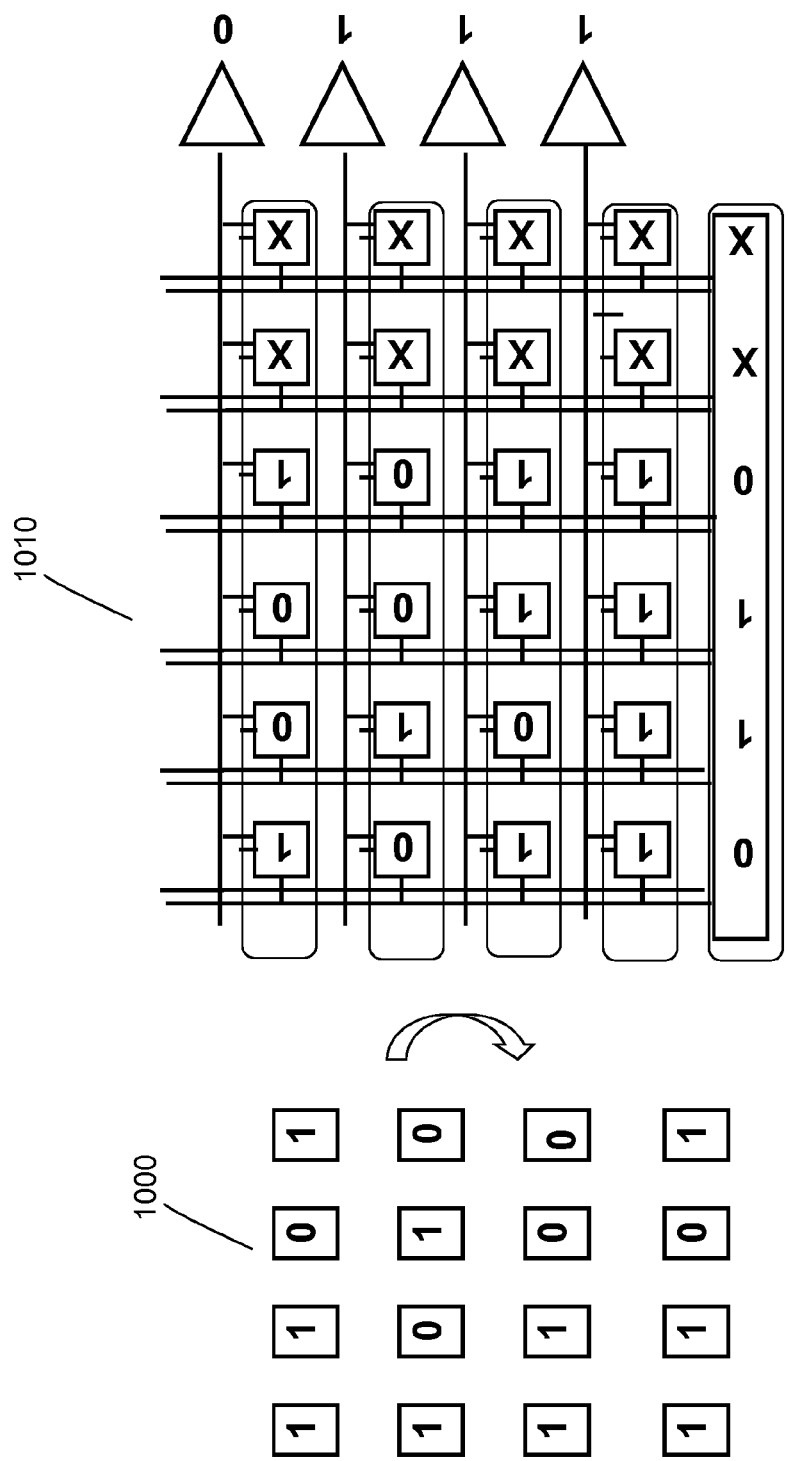
FIG. 10 is a schematic diagram illustrating the writing of a TCAM to implement a computational memory according to one embodiment of the present invention.

FIG. 10 is a schematic diagram illustrating the writing of a TCAM with a transposed matrix of data and assigning of don't care bits to empty cells in order to implement a computational memory according to one embodiment of the present invention. As shown in FIG. 10, a 4×4 matrix of data 1000 is transposed and written into a TCAM 1010. The matrix of data 1000 is transposed such that the first row becomes the first column in TCAM 1010. In addition, the second row becomes the second column in TCAM 1010, while the third row becomes the third column and the fourth row in the matrix of data becomes the fourth column in the TCAM. Those skilled in the art would appreciate that the matrix of data transpose could be performed by implementing a software routine and then writing the data into the TCAM. In this example, TCAM 1010 had two columns that were not filled by the transposed data and were subsequently filled with don't care bits (X). TCAM 1010 is then ready to serve as a computational memory. As shown in FIG. 10, TCAM 1010 performs a bitwise operation that is a combination of a NOR and an AND operation as described above with respect to FIG. 5.

Figure 11:
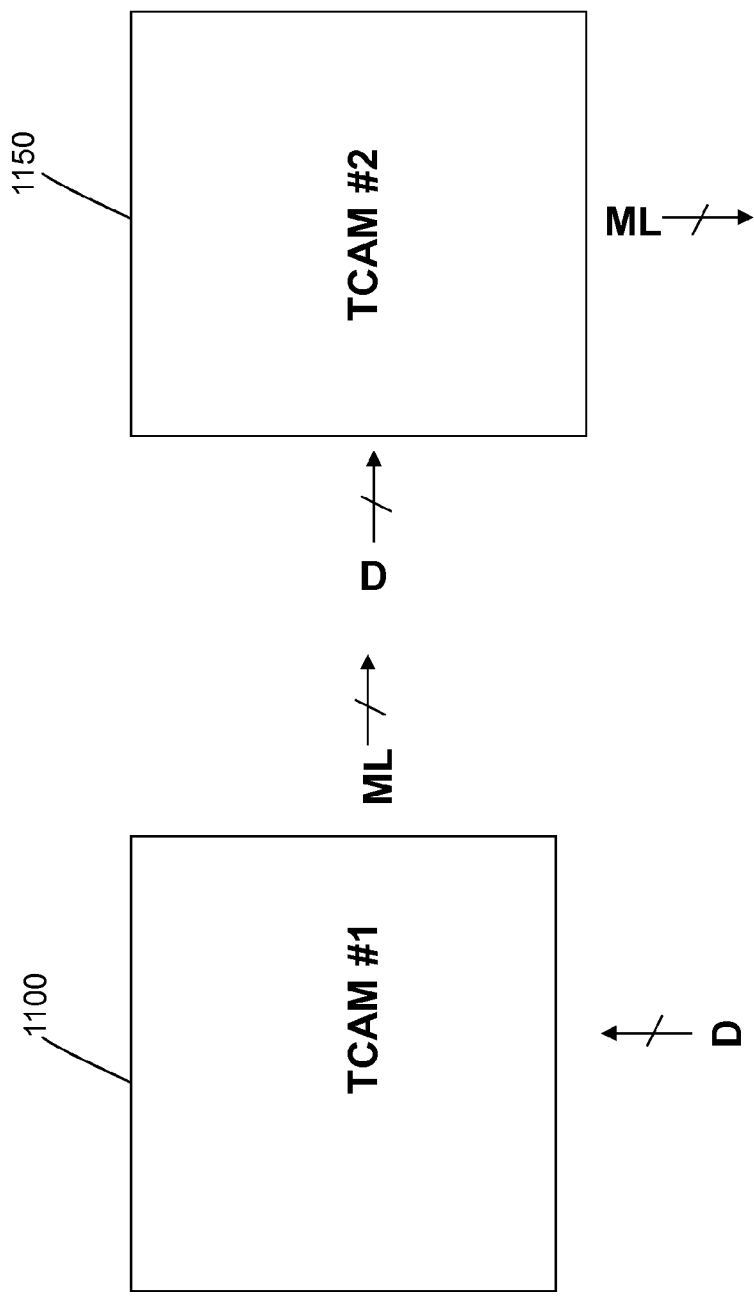
FIG. 11 is a schematic diagram illustrating the writing of a TCAM to implement a computational memory according to another embodiment of the present invention.

FIG. 11 is a schematic diagram illustrating the writing of a TCAM with a transposed matrix of data in order to implement a computational memory according to another embodiment of the present invention. In this embodiment, a matrix of data is loaded into a first TCAM 1100. Although not shown, in this figure, first TCAM 1100 would comprise TCAM cells arranged in an array of rows and columns, with each column having a pair of search lines to broadcast data D and each row having a match line ML. In this embodiment, the matrix of data can be loaded row by row into first TCAM 1100 until all data is loaded. Next, data in the rows and columns of the first TCAM 1100 are transferred to a second TCAM 1150 having a plurality of TCAM cells arranged in an array of rows and columns with each column having a pair of search lines to broadcast data D and each row having a match line ML. In this embodiment, the data is transferred by reading data in the columns of the first TCAM 1100 and writing the data in the columns of the first TCAM into the rows of the second TCAM 1150. In this manner, each column of data in the first TCAM 1100 is loaded into the rows of the second TCAM 1150, effectively transposing the matrix of data.

Referring back to flow chart 900 of FIG. 9, the TCAM is ready to operate as a computational memory once the TCAM has been written with the transposed data and assigned don't care (X) bits to any empty columns that remain after loading the data. In particular, a search line controller can then generate an instruction control set at 925 that selectively activates certain search lines in the pairs of search lines. This effectively enables the TCAM to perform bitwise logical operations at 930 that is in accordance with the state of the search lines (i.e., active, inactive) and the state of the data bit that is to be broadcast into the TCAM.

The foregoing flow chart shows some of the processing functions associated with implementing a computational memory from a CAM such as a TCAM. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

As described herein, the various embodiments of the present invention set forth an approach for implementing a computational memory from a CAM such as a TCAM. In particular, the search lines pairs in the TCAM can be configured to be selectively activated or deactivated. Selectively activating or deactivating the search lines pairs enables the TCAM to operate as a computational memory and perform Boolean bitwise logical operations in addition to performing read and write operations. With this approach, an off-the-shelf TCAM can be configured to implement a distributed ALU across memory without any customization. By modifying the logic around the TCAM the memory can perform bitwise logical operations such as OR and AND on multiple words concurrently. Executing these operations enables the implementation of any logic function on any combination of stored words in the memory array.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A computational memory device, comprising:
   an array of content addressable memory (CAM) cells arranged in rows and columns;
   a pair of search lines associated with each column of the array; and
   a match line associated with each row of the array;
   wherein the array is configured to implement, for a given cycle, either a read operation of data contained in a single selected column, or one of a plurality of different bitwise logical operations on data contained in multiple selected columns, all of the pairs of search lines in the columns of the array configured to a certain state to implement the read operation or the one of the plurality of different bitwise logical operations, a result of the read operation or the one of the plurality of different bitwise logical operations outputted onto all of the match lines in the array, wherein the configuring comprises a data bit and a bit enable assignable to each pair of search lines associated with the columns in the array of the CAM, the data bit determining whether each search line in the pair of search lines is activated or deactivated, and the bit enable determining whether the column in the array of the CAM is masked from performing the read operation or the one of the plurality of different bitwise operations.

2. The computational memory device of claim 1, wherein the plurality of different bitwise logical operations implementable by the array for a given cycle include OR operations, NAND operations, and combinations thereof.

3. The computational memory device according to claim 2, wherein for the OR operation of data contained in multiple selected columns in the array of the CAM cells, a first search line of each of the multiple selected columns is activated, a second search line of each of the multiple selected columns is deactivated, and the first and second search lines of all other non-selected columns are deactivated.

4. The computational memory device according to claim 2, wherein for the NAND operation of data contained in multiple selected columns in the array of the CAM cells, the second search line of each of the multiple selected columns is activated, the first search line of each of the multiple selected columns is deactivated, and the first and second search lines of all other non-selected columns are deactivated.

5. The computational memory device according to claim 2, wherein for the combination of OR and NAND operations of data contained in multiple selected columns in the array of the CAM cells, either the first search line or the second search line of each of the multiple selected columns is activated, and the first and second search lines of all other non-selected columns are deactivated.

6. The computational memory device according to claim 1, wherein for the read operation of data contained in a single selected column in the array of the CAM cells, a first search line of the selected column is activated, a second search line of the selected column is deactivated, and the first and second search lines of all other non-selected columns are deactivated.

7. The computational memory device according to claim 1, wherein each of the CAM cells comprise:
- a pair of SRAM storage elements each configured to store a data bit therein;
- a first NFET stack associated with one of the SRAM storage elements in the pair of SRAM storage elements and one of the search lines in the pair of search lines corresponding to the column of the cell in the array; and
- a second NFET stack associated with another of the SRAM storage elements in the pair of SRAM storage elements and another of the search lines in the pair of search lines corresponding to the column of the cell in the array;
- wherein both the first and second NFET stacks are configured to discharge a precharged match line associated with a corresponding row of the cell in the array, depending upon a state of the associated match line and data in the SRAM storage elements.

8. The computational memory device according to claim 1, wherein CAM cells in some of the rows and columns of the array are arranged with don't care bits.

9. A system, comprising:
- a computational memory including an array of ternary content addressable memory (TCAM) cells arranged in rows and columns, a pair of search lines associated with each column of the array, a match line associated with each row of the array; and
- a search line controller, operatively coupled to the computational memory, that is configured to provide an instruction code set to the array that selectively activates certain search lines in the array to perform a read operation of data contained in a single column in the array or one of a plurality of different bitwise logical operations between data in different columns of the array, wherein the instruction code set comprises a data bit and a bit enable assignable to each pair of search lines associated with the columns in the array of the TCAM, the data bit determining whether each search line in the pair of search lines is activated or deactivated, and the bit enable determining whether the column in the array of the TCAM is masked from performing the read operation or the one of the plurality of different bitwise operations.

10. The system according to claim 9, wherein a result of the read operation or the plurality of different bitwise logical operations is outputted onto all of the match lines in the array of the TCAM.

11. The system according to claim 9, wherein each of the TCAM cells comprise:
- a pair of SRAM storage elements each configured to store a data bit therein;
- a first NFET stack associated with one of the SRAM storage elements in the pair of SRAM storage elements and one of the search lines in the pair of search lines corresponding to the column of the cell in the array; and
- a second NFET stack associated with another of the SRAM storage elements in the pair of SRAM storage elements and another of the search lines in the pair of search lines corresponding to the column of the cell in the array;
- wherein both the first and second NFET stacks are configured to discharge a precharged match line associated with a corresponding row of the cell in the array, depending upon a state of the associated match line and data in the SRAM storage elements.

12. A method, comprising:
- obtaining a matrix of data;
- transposing the matrix of data;
- writing the transposed matrix of data into a ternary content addressable memory (TCAM) having a plurality of TCAM cells arranged in an array of rows and columns, a pair of search lines associated with each column in the array, and a match line associated with each row of the array; and
- selectively activating certain search lines in the array of the TCAM to perform a read operation of data contained in a single column in the array or one of a plurality of different bitwise logical operations between data in different columns in the array, wherein the selectively activating comprises a data bit and a bit enable assignable to each pair of search lines associated with the columns in the array of the TCAM, the data bit determining whether each search line in the pair of search lines is activated or deactivated, and the bit enable determining whether the column in the array of the TCAM is masked from performing the read operation.

13. The method according to claim 12, wherein the transposing of the matrix of data and the writing of the transposed matrix of data into the TCAM comprises:
- loading the matrix of data into a first TCAM having a plurality of TCAM cells arranged in an array of rows and columns, each row of the matrix of data loaded into a row of the first TCAM; and
- transferring data in the rows and columns of the first TCAM to a second TCAM having a plurality of TCAM cells arranged in an array of rows and columns, the data transferred by reading data in the columns of the first TCAM and writing the data in the columns of the first TCAM into the rows of the second TCAM, each column of data in the first TCAM loaded into the rows of the second TCAM, effectively transposing the matrix of data.

14. The method according to claim 12, further comprising assigning TCAM cells in rows and columns of the array in the TCAM that are empty after writing the transposed matrix of data into the TCAM with don't care bits.

15. The method according to claim 12, wherein the plurality of different bitwise logical operations implementable by selectively activating certain search lines in the array of the TCAM include OR operations, NAND operations, and combinations thereof.

16. The method according to claim 15, wherein for the OR operation of data contained in multiple selected columns in the array of the TCAM, a first search line of each of the multiple selected columns is activated, a second search line of each of the multiple selected columns is deactivated, and the first and second search lines of all other non-selected columns are deactivated.

17. The method according to claim 15, wherein for the NAND operation of data contained in multiple selected columns in the array of the TCAM, the second search line of each of the multiple selected columns is activated, the first search line of each of the multiple selected columns is deactivated, and the first and second search lines of all other non-selected columns are deactivated.

18. The method according to claim 15, wherein for the combination of OR and NAND operations of data contained in multiple selected columns in the array of the TCAM, either the first search line or the second search line of each of the multiple selected columns is activated, and the first and second search lines of all other non-selected columns are deactivated.

19. The method according to claim 15, wherein for the read operation of data contained in a single selected column in the array of the TCAM, a first search line of the selected column is activated, a second search line of the selected column is deactivated, and the first and second search lines of all other non-selected columns are deactivated.

* * * * *